United States Patent
Huang

(10) Patent No.: US 6,205,515 B1
(45) Date of Patent: *Mar. 20, 2001

(54) COLUMN REDUNDANCY CIRCUITRY WITH REDUCED TIME DELAY

(75) Inventor: Eddy C. Huang, San Jose, CA (US)

(73) Assignee: Winbond Electronic Corporation, Hsin-Chu (TW)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/042,893

(22) Filed: Mar. 16, 1998

(51) Int. Cl.[7] .............................. G06F 11/22; G06F 12/00
(52) U.S. Cl. ........................ 711/104; 711/101; 711/105; 711/170; 711/173; 711/152; 714/40; 714/41; 714/42
(58) Field of Search ............................ 365/51, 63, 200, 365/201, 230.03; 714/1, 6, 7, 41, 25, 42; 711/104, 105, 101, 170; 395/180, 182.04; 707/206; 371/10.2, 10.3

(56) References Cited

U.S. PATENT DOCUMENTS

| 4,459,685 | * | 7/1984 | Sud et al. ............................ 365/200 |
| 4,639,897 | * | 1/1987 | Wacyk ................................. 365/200 |
| 4,727,516 | * | 2/1988 | Yoshida et al. ...................... 365/200 |
| 5,262,994 | * | 11/1993 | McClure ............................. 365/200 |
| 5,450,361 | * | 9/1995 | Iwahashi et al. .................... 365/200 |
| 5,475,640 | * | 12/1995 | Kersh, III et al. ................... 365/200 |
| 5,532,965 | * | 7/1996 | Kenney .............................. 365/200 |
| 5,544,113 | * | 8/1996 | Kirihata et al. ..................... 365/200 |
| 5,561,636 | * | 10/1996 | Kirihata et al. ..................... 365/201 |
| 5,796,662 | * | 8/1998 | Kalter et al. ........................ 365/200 |

* cited by examiner

Primary Examiner—Than Nguyen
(74) Attorney, Agent, or Firm—Burns, Doane, Swecker & Mathis, L.L.P.

(57) ABSTRACT

A system and method of implementing column redundancy in a memory system in which a single set of redundant columns is provided in one of a plurality of blocks of columns which is the fastest to receive decoded select signals or which is physically located closest to decode circuitry. In normal operation, the decode circuitry selects a single column and block as determined by the input address signal. In redundancy mode, the input address is compared to a pre-programmed repair column and block address corresponding to the a previously determined defective column and a match signal is generated. The match signal functions to enable the block having the redundant columns and disable the sense amplifiers of all other blocks. In addition, the match signal disables all of the columns in the selected redundancy block other than a single redundant column. As a result, all redundant columns have approximately the same access time as the fastest block of columns in the memory system. In addition since, redundant columns are not included in each block of columns, a reduced number of redundant columns are used and silicon space is conserved.

4 Claims, 3 Drawing Sheets

COLUMN REDUNDANCY CIRCUITRY WITH REDUCED TIME DELAY

BACKGROUND OF THE INVENTION

1. Field of the Invention

The present invention relates to redundancy in memory circuits, and more particularly to accessing redundant columns.

2. State of the Art

Redundancy is used in memory systems having memory arrays to replace failed rows, columns, or single cells in the array. To implement redundancy in a memory system, spare (or redundant) replacement rows or columns and redundancy circuitry are designed into the memory structure. The redundancy circuitry functions to disable the failed row or column to be replaced as well as enable a redundant row or column such that when the failed row or column is accessed by its corresponding address, the redundant TOW is accessed instead.

FIG. 1 shows the conventional structure of a memory system 10 using column redundancy including a memory array 11, sets of redundant columns 0–N, and address decoder and redundancy circuitry 12. The memory array 11 is divided into blocks of columns Block <0>, Block <1>, ... Block <N> and each block includes a corresponding set of redundant columns 0–N, respectively. Each block has a corresponding sense amplifier 13 for sensing data from its corresponding block and provides it to output 14.

During a normal access operation, the address decoder provides a block select signal to select and enable data sensing from one of the N blocks in which the access operation is to occur, and provides column and row select signals to select and access the specific memory cells within the selected block.

The redundant circuitry 12 includes decode circuitry coupled to each redundant column. The decode circuitry includes the same number of fuses as bits in the column address. During device testing when a defective column is detected, its address is programmed into one of the redundant column's associated decode circuitry by blowing its fuses so as to match the defective column address. Programming the redundancy circuitry with the defective columns address also permanently disables the defective column such that the redundant column is accessed instead of the defective column.

In an access operation in which a defective column is being accessed, the address decoder provides a block select and enable signal to the block in which the defective column resides. However, when the defective column address is decoded by the address decoder and redundancy circuitry, the redundant column is accessed instead of the defective column. For instance, if a defective column in Block 1 is accessed, Block 1 is enabled but one of the redundant columns in redundant column set 1 is accessed instead of the defective column.

In the memory structure shown in FIG. 1 having N blocks of columns each including a set of redundant columns, decode circuitry each having as many fuses as column address bits is required for each redundant column in each of the N sets of redundant columns. As can be imagined this redundancy design tends to consume significant wafer space.

In addition, another disadvantage of this type of design relates to the relative position of the blocks of columns and each block's associated access time. Specifically, address select signals and in particular row (or wordline) select signals are generated by the address decode. These signals are transmitted to each block along a single wordline address. As a result, due to the propagation time for the select signal to travel from the decode circuitry to each of the blocks, blocks that are farther from address decode (e.g. block N) receive the select signals later than closer blocks. Hence, the addition of redundant columns tends to extend out the farthest block position even more, thereby increasing the delay of select signals. Since each set of redundant columns exhibits the same access time as the block it resides in, if a column is replaced in the Nth block, then the redundant column will also exhibit the same approximate longer access time as the Nth block. Moreover, the extra capacitive loading caused by the redundant columns in each block slows sensing of data even more for all blocks and in particular the Nth block such that the overall access time for the device is increased still.

The present invention is a manner in which to incorporate redundancy into a memory system such that less space is used and the access time of redundant columns in the memory system is reduced.

SUMMARY OF THE INVENTION

The present invention is a memory system including redundancy for replacing defective columns in the memory array and method thereof. The memory system includes a memory array divided into a plurality of blocks of columns 0–N and a single set of redundant columns residing within the block of columns which is either the fastest accessed block or the block which is located closest to the select signal generators (i.e., the address decode and the redundancy circuitry). Redundancy circuitry compares the input address to pre-programmed defect column addresses. If a match occurs, the redundancy circuitry provides a match signal that enables the fastest block for sensing data, selects a redundant column, deselects all regular columns in the fastest block, and disables all other blocks. If a match does not occur, an address decode portion decodes the input address and provides at least a block select signal, a column select signal and a row select signal for accessing the memory array in a normal access operation.

In one embodiment, row redundancy is incorporated into a memory system by adding redundant rows to the closest or fastest block, enabling only the closest or fastest block when a redundant row address matches an input row address, disabling all other blocks, disabling all of the enabled block rows, and enabling the redundant row.

BRIEF DESCRIPTION OF THE DRAWINGS

The present invention may be further understood from the following written description in conjunction with the appended drawings. In the drawings.

DETAILED DESCRIPTION OF THE PREFERRED EMBODIMENTS

The present invention, in general, is a memory system that implements redundancy by incorporating the redundant columns or rows into the fastest accessed portion of the memory array so as to reduce access time of redundant columns or rows and minimize space consumed by the redundancy. In a preferred embodiment, the system and method applies to column redundancy in which a defective column is replaced by a spare or redundant column within the memory system.

Figure 2:
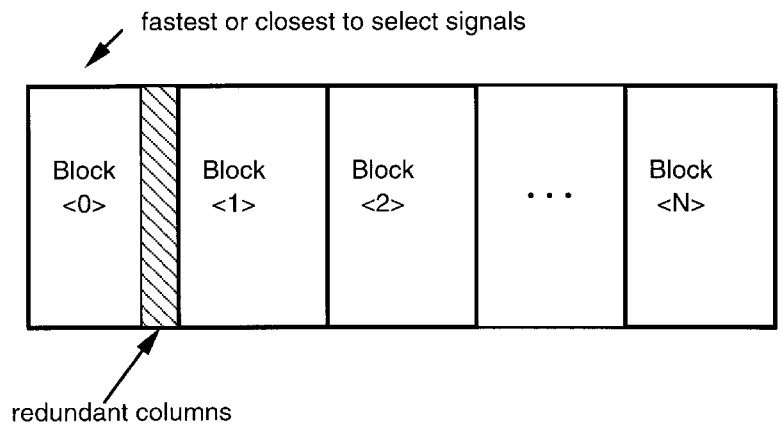
FIG. 2 is a memory system including column redundancy in accordance with the system and method of the present invention.

FIG. 2 shows a memory array including blocks of columns Blocks 0–N in which block <0> includes a set of redundant columns. Block <0> can be characterized as either the block that receives the select signals the fastest or the block that is located closest to the block select, column select, and row select signals. In one embodiment, it is the block which resides next to the address decode circuitry. It should be noted that in FIG. 2 the redundant columns located on the right hand side of block <0> can be located in other areas within block <0> (e.g. left hand side) and in general redundant columns are located within a memory block so as to have an access time approximately the same as the fastest memory block in the array.

Figure 1:
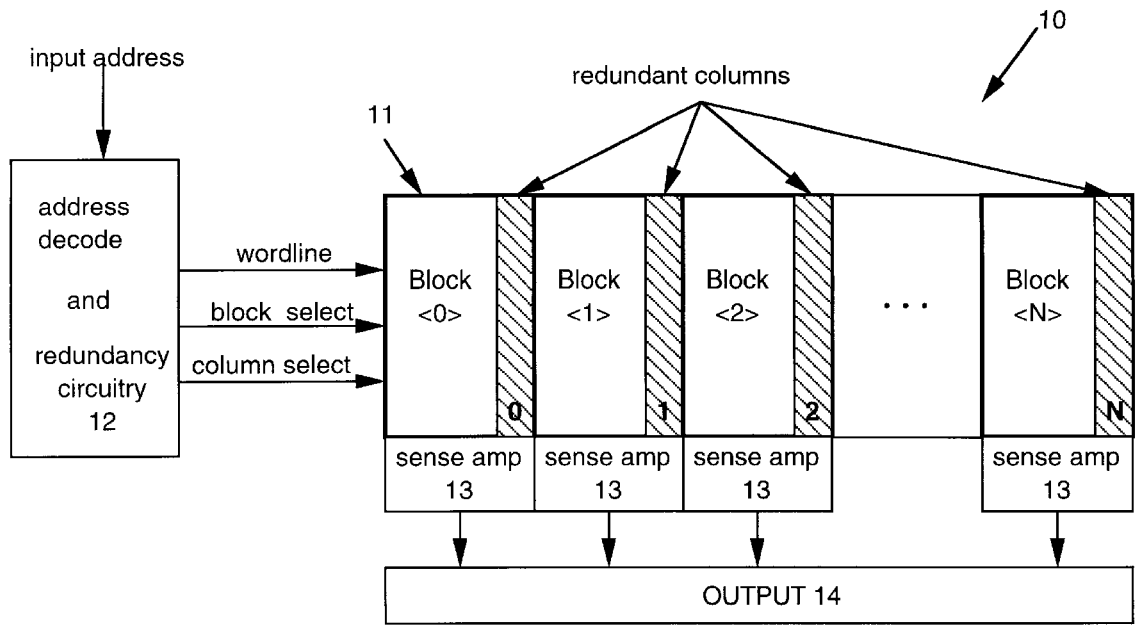
FIG. 1 is a prior art memory system including redundant columns and redundancy circuitry.

The number of redundant columns in the set of redundant columns is a design decision which depends on the amount of space that is desired to be designated to redundancy. It should be noted that the total number of redundant columns in the memory system shown in FIG. 2 does not necessarily correspond to the total number of columns shown in prior art memory system FIG. 1 and, in the preferred embodiment, is less than the total number of redundant columns shown in FIG. 1. Specifically, redundant columns are used to improve yield by "fixing" defective memory devices. If a memory device is tested and has a single defective column, this device has a high probability that, overall, it is functionally sound after being fixed. However, a device having many defective columns and requiring many redundant columns, has a high probability of failing other tests and, generally, is rejected instead of "fixed". Consequently, reducing the total number of redundant columns does not necessarily impact the yield of memory devices since it is not desirable to use large numbers of redundant columns.

Figure 3:
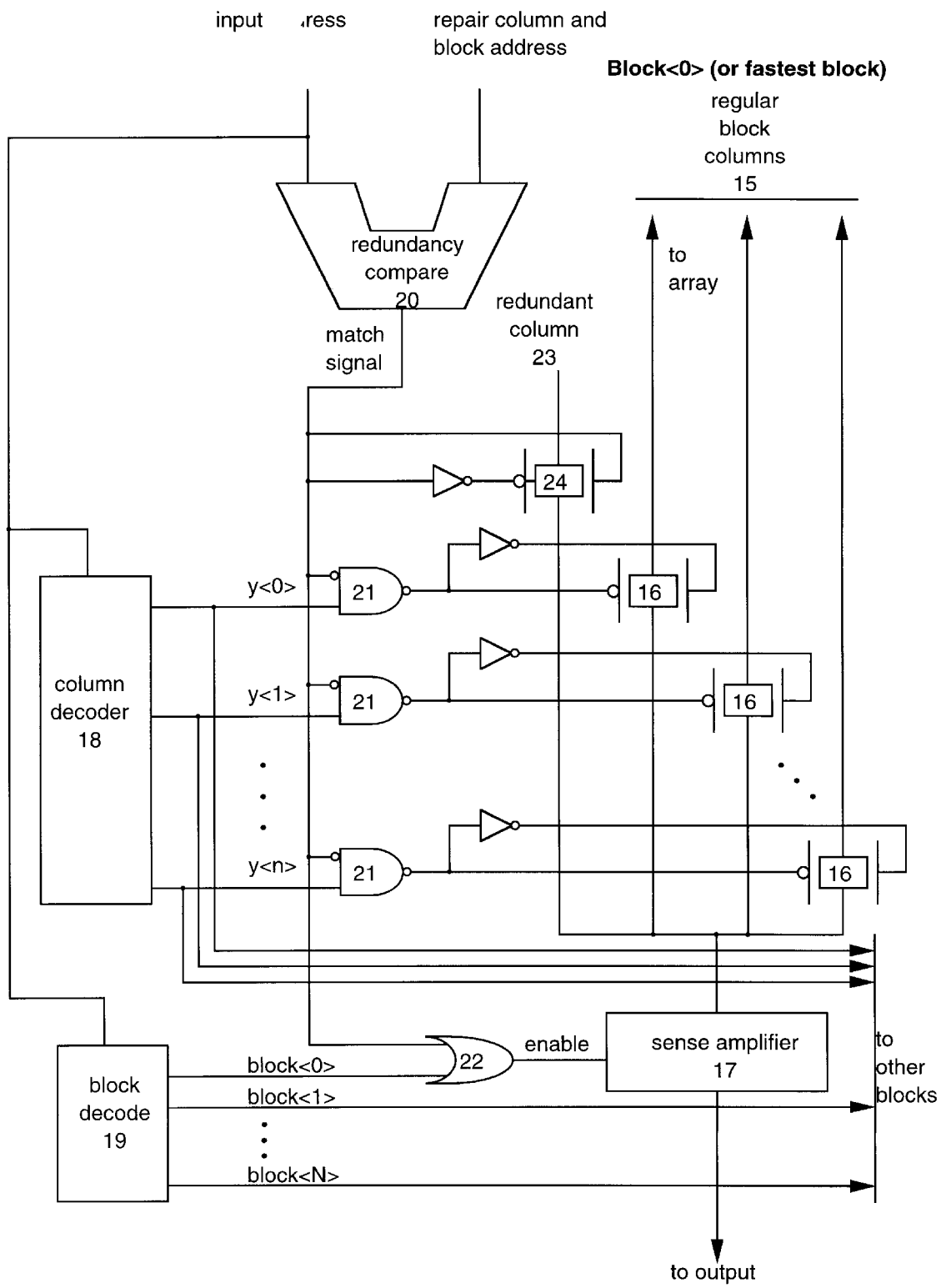
FIG. 3 shows one implementation for selecting a redundant column within the fastest or closest block of columns within the memory array.

FIG. 3 shows one embodiment of the selection and redundancy circuitry used to access the redundant columns shown in FIG. 2. In this embodiment, redundant columns are located in block <0>. The regular block columns 15 which connect to the memory array are each coupled to a pass gate 16 which in turn are all coupled to sense amplifier 17. Only one of pass gates 16 is enabled at a time such that the data in the memory cell coupled to the selected column and selected wordline (not shown) is passed to the sense amplifier where it is detected and passed to the output.

An input address is coupled to column decoder 18, block decoder 19 and compare redundancy circuit 20. The input address is also decoded to generate wordline select signals for selecting a row within the array (not shown). In normal operation in which the input address does not match the repair column and block address, compare redundancy circuit 20 outputs a LOW signal. As a result, each of NAND gates 21 have one input coupled to a HIGH signal such that its other input determines the output level of each of NAND gates 21. The input address is decoded by column decoder 18 such that one of the column select signals y<0>, y<1>, ... y<n> is HIGH and the remainder are LOW. As a result, the NAND gate 21 of the selected column will have a LOW output (due to its inverted input), while the remaining NAND gates 21 of the unselected columns output a HIGH signal. In addition, with the match signal LOW, one input of OR gate 22 is LOW such that its other input determines the output level of gate 22. The input address is coupled to block decoder 19 such that one of the block<0>, block<1>, ... block<n> signals is HIGH and the remainder are LOW. In the case when block<0> is selected, the block<0> signal is HIGH and OR gate 22 outputs a HIGH enable signal to the sense amplifier 17 so as to allow data to be sensed from the selected regular column in block<0>. In the case when the match signal is LOW but a different block select signal is HIGH then the sense amplifier in that block will be enabled and senses the data from the selected regular column in that block. Hence, when the match signal is LOW, the selection circuitry selects the column and block according to the decoded column and block select signals from column and block decoders 18 and 19, respectively.

In the case when the input address matches the repair column and block address that is pre-programmed into redundancy circuitry (not shown), the redundancy compare circuit 20 outputs a HIGH match signal. In this case, the redundant column 23 selected by pass gate 24. Moreover, when the match signal is HIGH one of the inputs of each of NAND gates 21 is LOW such that no matter what the y select signals y<0>, y<1>, ... y<n> are the output of all of the NAND gates 21 is HIGH and all of the regular column pass gates 16 are disabled. In addition, with the match signal HIGH, one of the inputs of OR gate 22 is HIGH. Consequently OR gate 22 outputs a HIGH enable signal no matter which block is selected. Hence, when a match occurs, the redundant column is enabled along with the block<0> sense amplifier 17, no matter what the decoded column and block address of the input address is.

Figure 4:
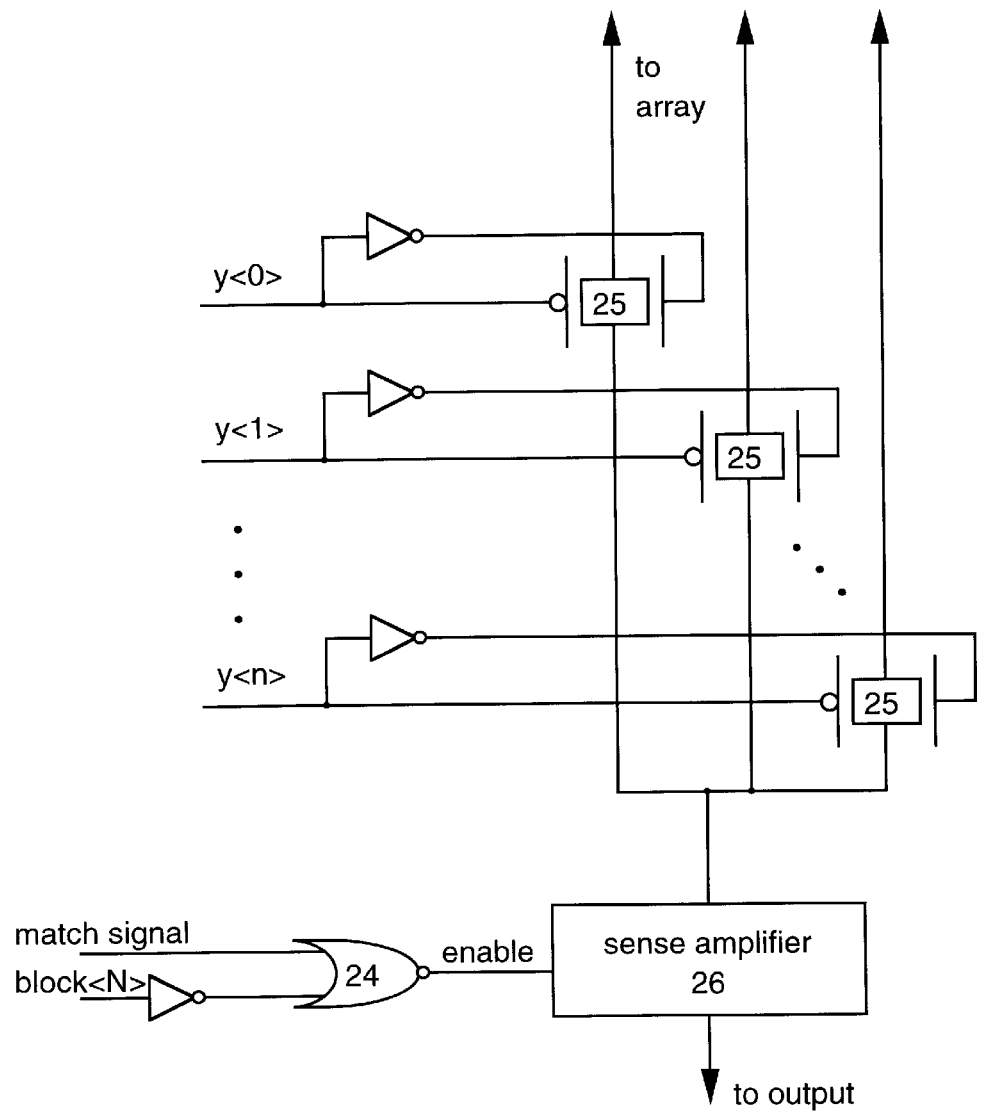
FIG. 4 shows one implementation for deselecting the remaining blocks in the memory system when a redundant column is being accessed.

FIG. 4 shows the circuit implementation for disabling all other blocks when the match signal is HIGH. In normal operation when the match signal is LOW, one of the y select signals is LOW while the remainder are HIGH such that only one of the pass gates 25 is enabled and its corresponding column is connected to sense amplifier 26. In addition, with the match signal LOW, one input of the NOR gate is LOW such that the block select signal determines whether the NOR gate outputs a HIGH enable signal to sense amplifier 26. For instance, if the block shown in FIG. 4 is selected, the block<N> signal is HIGH, and the NOR gate outputs a HIGH enable signal when the match signal is LOW. Alternatively if the block is not selected the block<N> signal is LOW, and the NOR gate outputs a LOW enable signal when the match signal is LOW.

In the redundancy mode, the match signal is HIGH. As indicated above, with the match signal HIGH, one of the y select signals y<0>, y<1>, ... y<n> is also HIGH and its corresponding pass gate 25 is enabled while the remainder of the y<0>, y<1>, ... y<n> signals are LOW and their corresponding pass gates are disabled. Moreover, with the match signal HIGH, one of the inputs of NOR gate 24 is HIGH such that NOR gate 24 outputs a LOW disabled signal no matter what the block signal<N> is. Hence, no matter what the input address is, the block is disabled during the redundancy mode.

It should be noted that FIG. 3 shows a single redundant column 23 having an associated pass gate 24 which is enabled by redundancy compare circuit 20 however, in a preferred embodiment, more than one redundant column is included. In this case, each redundant column has a unique pass gate which is enabled by a unique match signal and redundancy compare circuit 20 which is coupled to a unique pre-programmed repair column and block address. In this way, when a input address is applied that matches one of the repair column and block addresses, only one redundant column is enabled.

Hence, column redundancy for a memory system is described which places all redundant columns in the fastest accessed block so that redundant column accessing time is minimized.

In the preceding description, numerous specific details are set forth, such as specific logic gates and select circuitry in order to provide a thorough understanding of the present invention. It will be apparent, however, to one skilled in the art that these specific details need not be employed to practice the present invention. In other instances, well-known memory system structures have not been described in order to avoid unnecessarily obscuring the present invention.

Moreover, although the components of the present invention have been described in conjunction with a certain embodiment, it is appreciated that the invention can be implemented in a variety of other ways. Consequently, it is to be understood that the particular embodiment shown and described by way of illustration is in no way intended to be considered limiting. Reference to the details of this embodiment is not intended to limit the scope of the claims which themselves recite only those features regarded as essential to the invention.

What is claimed is:

1. A method of accessing a memory array including a plurality of blocks of columns each block sensing data independently, wherein said each block has an associated accessing address and each column has an associated accessing address, and wherein each of said plurality of blocks has an associated access time factor relating to its relative position in said memory array which determines the speed at which select signal are made available to said each block, said method comprising the steps of:

including in one of said plurality of blocks a set of redundant columns, wherein said one block has the fastest access time factor than any other of said plurality of blocks;

accessing said array with non-defective column input addresses each having an associated decoded block select address and a decoded column select address wherein data is accessed from said array at said non-defective input address associated decoded block and column select addresses;

accessing said array with defective column input addresses each having an associated decoded block select address and column select address wherein data is accessed from one of said set of redundant columns in said one block instead of said defective column input addresses' associated decoded block and column select address; and wherein said step of accessing with said array with said defective column input addresses and said step of accessing said array with said non-defective column input addresses comprises the steps of comparing one of said defective column and non-defective column input addresses to at least one pre-programmed repair block and column address to generate a match signal, said match signal having a first state indicating that no match exists and a second state indicating a match exists.

2. The method as described in claim 1 wherein said step of accessing said array with said defective column input addresses further comprises the steps of using said match signal in said second state to:

enable data sensing from said one block and disable data sensing from said other blocks;

deselect said associated column select address of said defective column address; and select said one of said set of redundant columns.

3. A memory system comprising:

a memory array including a plurality of blocks of columns of memory cells for storing data, each block having an associated block select address for enabling data sensing in said each block and each column having an associated column select address for accessing said each column, wherein each of said plurality of blocks has an associated access time factor relating to its relative position in said memory array which determines the speed at which data is available from said each block;

a set of redundant columns residing in one of said blocks, wherein said one block has the fastest access time factor;

means for comparing said input signal having a corresponding non-defective decoded column select address and non-defective decoded block select address to at least one pre-programmed repair column select address and block select address corresponding to a defective column and generating at least one signal indicating whether a match has occurred;

a means for accessing said array with said input address such that data is accessed from said non-defective decoded column select address and non-defective decoded block select address when said match signal is in a first state and said input address does not match said pre-programmed column and block select addresses;

means for disabling sensing of data from all blocks except said one block in response to said at least one match signal in a second state and said input signal matches said pre-programmed address;

means for enabling sensing of data from said one block in response to said at least one match signal in said second state;

means for deselecting all columns in said one block except for said set of redundant blocks in response to said at least one match signal in said second state; and means for selecting one of said set of redundant columns for sensing data in response to said at least one match signal in said second state.

4. The system as described in claim 3 wherein said accessing means comprises a column decoder for providing said non-defective decoded column select address, a block decoder for providing said non-defective decoded block select address, and selection logic responsive to said at least one match signal for selecting said non-defective decoded column select address and said non-defective decoded block select address for accessing said array when said at least one match signal is in said first state, and for selecting said one of said set of redundant columns when said at least one match signal is in said second state.

* * * * *